(12) United States Patent
Thesen

(10) Patent No.: US 6,559,641 B2
(45) Date of Patent: May 6, 2003

(54) METHOD FOR OPERATING A MAGNETIC RESONANCE TOMOGRAPHY APPARATUS WHEREIN THE LOCATION CODING IS ADAPTED TO A POSITIONAL CHANGE OF THE EXAMINATION SUBJECT

(75) Inventor: Stefan Thesen, Meckenheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/734,977

(22) Filed: Dec. 11, 2000

(65) Prior Publication Data

US 2001/0005135 A1 Jun. 28, 2001

(30) Foreign Application Priority Data

Dec. 10, 1999 (DE) .......................................... 199 59 719

(51) Int. Cl.[7] .................................................. G01V 3/00
(52) U.S. Cl. ........................................ 324/307; 324/309
(58) Field of Search ................................. 324/307, 309

(56) References Cited

U.S. PATENT DOCUMENTS 5,042,485 A * 8/1991 Sano et al. .................. 324/306
5,204,625 A * 4/1993 Cline et al. .................. 324/306
5,233,302 A * 8/1993 Xiang et al. ................. 324/309
5,800,354 A * 9/1998 Hofland et al. ............. 324/309
5,814,991 A * 9/1998 Deimling ..................... 324/309
5,931,781 A * 8/1999 De Boer ...................... 324/318
5,938,600 A * 8/1999 Van Vaals et al. .......... 324/306
6,114,852 A * 9/2000 Zhou et al. .................. 324/306

* cited by examiner

Primary Examiner—Edward Lefkowitz
Assistant Examiner—Dixomara Vargas
(74) Attorney, Agent, or Firm—Schiff Hardin & Waite

(57) ABSTRACT

In a method for the operation of a magnetic resonance tomography apparatus having a gradient system and a radio-frequency system that, among other things, serve for location coding, a region to be imaged in an examination subject is placed in an imaging volume of the apparatus. Image datasets of at least parts of the region to be imaged are generated in a time sequence. A positional change of at least a part of the region to be imaged with respect to the imaging volume is determined by a comparison of at least a first image dataset to a second image dataset that have been generated in chronological succession. A location coding is adapted corresponding to the identified positional change for at least one image dataset that is generated following the compared image datasets in time.

7 Claims, 4 Drawing Sheets

METHOD FOR OPERATING A MAGNETIC RESONANCE TOMOGRAPHY APPARATUS WHEREIN THE LOCATION CODING IS ADAPTED TO A POSITIONAL CHANGE OF THE EXAMINATION SUBJECT

BACKGROUND OF THE INVENTION

1. Field of the Invention

The present invention is directed to a method for operating a magnetic resonance tomography apparatus with a gradient system and a radio-frequency system that, among other things, serve for location coding.

2. Description of the Prior Art

Magnetic resonance tomography is a known technology for acquiring images of the inside of the body of an examination subject. In a magnetic resonance tomography apparatus, rapidly switched gradient fields that are generated by a gradient system are thereby superimposed on a static basic magnetic field. The magnetic resonance tomography apparatus also has a radio-frequency system that emits radio-frequency signals into the examination subject for triggering magnetic resonance signals and picks up the generated magnetic resonance signals. Image datasets are produced on the basis of these magnetic resonance signals. The gradient system and possibly the radio-frequency system are set such that, among other things, they effect a location coding within the examination subject.

All methods that use a repeated scanning of a structure of organs and tissues in order to image processes that change over time, for instance physiological functions or pathological events, are generically referred to as functional imaging in general medicine. In the narrower sense in magnetic resonance tomography, functional imaging means measuring methods that make it possible to identify and image brain areas of a patient that participate in a specific motor, sensory or cognitive task. To this end, three-dimensional datasets of the brain are registered, for example, every two through four seconds, for example with an echo planar method. Echo planar methods have the advantage that the image dataset registration required for a single three-dimensional dataset is obtained very fast, in less than 100 ms.

An image dataset thereby contains a number of picture elements that, with a suitable arrangement, generate an image in a grid-like raster. A picture element, for example, is characterized by a value on a gray scale as well as by its coordinates, i.e. its position within the image. For a two-dimensional image, for example, the picture elements are entered in a two-dimensional matrix that forms a two-dimensional image dataset. The arrangement within the matrix thereby defines the coordinates of the picture elements in the image. The analogous case applies to a three-dimensional image dataset.

After many image datasets with coinciding location coding have been registered at different points in time within the framework of a functional magnetic resonance tomography procedure, image datasets are subtracted from one another for forming images referred to as activation images, i.e. the datasets compared to one another in terms of signal differences for the identification of active brain areas. Even the slightest movements of the brain during the entire registration time span produce undesired signal differences that mask the brain activation being sought.

For filtering out the aforementioned undesired signal differences, correction referred to as a retro-perspective motion correction of the image datasets is first implemented, which assumes an acquisition of positional changes as a result of movements. A method for this is based, for example, on the assumptions that movements occur only between the registrations of individual, complete image datasets, and that the brain can be considered to be a rigid body. Further, an arbitrary rigid body movement in three-dimensional space is described with six motion parameters, whereby three parameters identify translations and three parameters identify rotations.

The aforementioned parameters are, for example, noted in a column vector $\vec{q}$. The values of all picture elements or of selected picture elements of a first image dataset and of a second image dataset that was generated temporally following the first are noted in a coinciding sequence in a first column vector $\vec{x}$ and a second column vector $\vec{y}$. For determining a positional change between the registration times of the first and of the second image dataset, i.e. for determining the motion parameters, the following equation (which is based on a Taylor expansion of the $1^{st}$ order) is solved, for example by an iterative method:

$$\vec{y} - \vec{x} = \begin{bmatrix} \frac{\partial x_1}{\partial q_1} & \cdots & \frac{\partial x_1}{\partial q_6} \\ \vdots & \ddots & \vdots \\ \frac{\partial x_n}{\partial q_1} & \cdots & \frac{\partial x_n}{\partial q_6} \end{bmatrix} \cdot \vec{q} \text{ with}$$

$$\vec{x} = \begin{bmatrix} x_1 \\ \vdots \\ x_n \end{bmatrix}; \vec{y} = \begin{bmatrix} y_1 \\ \vdots \\ y_n \end{bmatrix}; \vec{q} = \begin{bmatrix} q_1 \\ \vdots \\ q_6 \end{bmatrix}$$

The above equation contains a Jacobean functional matrix that has partial derivatives of the elements of the column vector $\vec{x}$ according to the six motion parameters per row. The book by R. S. J. Frackowiak et al., *Human Brain Function*, Academic press, 1997, particularly Chapter 3, pages 43–58, is referenced for a more detailed description of the aforementioned method for determining positional changes from image datasets. The article by U. Klose et al., "Funktionelle Bildgebung mit der Magnetresonanztomographie", elektromedica 67 (1999) Number 1, pages 27–36, can be consulted for a more detailed description of the procedure in functional magnetic resonance tomography with a retro-perspective motion correction of image datasets that occurs temporally following a complete registration of all image datasets of functional magnetic resonance tomography.

Several methods for retro-perspective motion correction assume that all undesired signal differences as a result of movements can be eliminated given an optimum retro-rotation or retro-shift of the image datasets with respect to a reference image dataset. Often left out of consideration, however, is that all undesired signal differences caused by movements cannot be filtered out with a mere geometrical shifting, or rotation of the image datasets. The reason for this is that, following a change in position of the brain, gradient fields and radio-frequency fields act differently on specific volume regions of the brain compared to the initial position given unaltered location coding, and thus excitation, resonance and relaxation properties of these volume regions change. As a result, the signal behavior of these volume regions is modified not only for an immediately successively registered image dataset but also persistently for further image datasets to be registered. If a volume region under consideration changes in position repeatedly during the overall functional magnetic resonance tomography, then each change in position has an influence—as a signal modification—more or less up to the last image dataset that is registered.

With respect to this latter signal modification and, for example, given a slice-by-slice registration of three-dimensional image datasets, those positional changes are particularly important for slices that are rotated or shifted in planes other than their own plane. This, for example, is described in greater detail in the article by K. J. Friston et al., "Movement-Related Effects in fMRI Time-Series", Magnetic Resonance in Medicine 35 (1996), pages 346–355. This article, moreover, proposes an approximation method with which the latter, motion-caused signal differences also can be filtered out of the image datasets following the production of image datasets in functional magnetic resonance tomography. Only very limited corrections are possible, however, with this approximation method.

Another approach for avoiding all undesired, motion-caused signal differences is, instead of correcting all image datasets in the context of a prospective motion correction afterwards, to acquire potential positional changes of the brain from image dataset to image dataset during the execution of a functional magnetic resonance tomography procedure and to appropriately adapt the location coding during the run.

In one embodiment of this known approach, positional changes of the head are optically acquired, for example by attaching optical reflectors to the head, these reflectors being monitored in terms of position by an optical detection system. Further details with respect thereto are explained, for example, in the article by H. Eviatar et al., "Real Time Head Motion Correction for Functional MRI", Proc. of ISMRM 7 (1999), page 269. Among the disadvantages of the aforementioned apparatus for acquiring positional changes is that a separate detection system is required. Moreover, actual positional changes of the scalp are acquired that do not necessarily accompany positional changes of the brain, such as due to the subject furrowing his or her brow.

In another embodiment of prospective motion correction, positional changes are acquired by orbital navigator echos. An orbital navigator echo is a magnetic resonance signal that is characterized by a circular k-space path and that is generated by a specific navigator sequence. Positional changes can be determined on the basis of orbital navigator echos that are generated at different points in time. Before, for example, each generation of an image dataset, the navigator sequence is implemented for this purpose and a navigator echo is registered, this being compared to a reference navigator echo for the motion correction. This, for example, is described in greater detail in the article by H. A. Ward et al., "Real-Time Prospective Correction of Complex Multiplanar Motion in fMRI", Proc. of ISMRM 7 (1999), page 270. Although no additional devices need be provided at a magnetic resonance tomography apparatus in an acquisition of positional changes with orbital navigator echos, the precision with which positional changes are acquired is comparatively poor. Further, each navigator sequence leads to excitations in additional to an imaging sequence, which have a disturbing effect due to saturation effects.

SUMMARY OF THE INVENTION

It is an object of the present invention to provide a method of the type initially described wherein the disadvantages of the known techniques and systems are avoided.

This object is inventively achieved in a method for the operation of a magnetic resonance tomography apparatus having a gradient system and a radio-frequency system that, among other things, serve for location coding wherein a region to be imaged in an examination subject is placed in an imaging volume of the apparatus, image datasets of at least parts of the region to be imaged are generated in a time sequence a positional change of at least a part of the region to be imaged with respect to the imaging volume is determined by a comparison of at least a first to a second image dataset that have been generated in chronological succession, and a location coding is adapted corresponding to the identified positional change for at least one image dataset that is generated following the compared image datasets in time.

Since, during a functional magnetic resonance tomography procedure, every generated image dataset is compared to a reference image dataset, positional changes can be detected with high precision and a location coding can be correspondingly adapted from image dataset to image dataset in the framework of a prospective motion correction. Positional changes down to approximately 40 μm as a result of translational movement and down to approximately 0.05° as a result of rotational movement can be determined. Moreover, no additional devices need to be provided at the magnetic resonance tomography apparatus for the implementation of the method.

In an embodiment, the method described above for determining positional changes from image datasets on the basis of a Taylor series expansion of the $1^{st}$ order is utilized.

DESCRIPTION OF THE PREFERRED EMBODIMENTS

Figure 1:
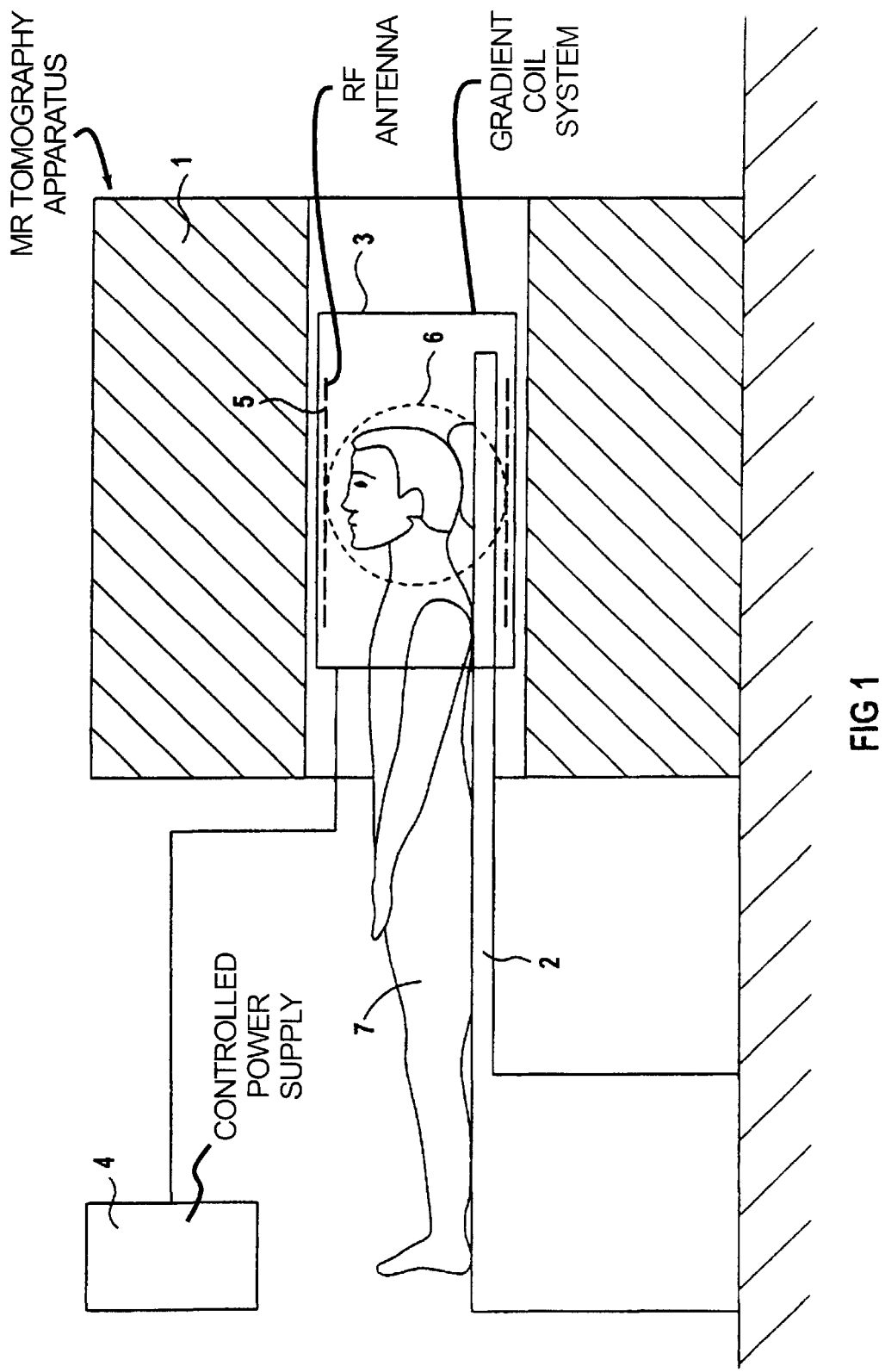
FIG. 1 is a longitudinal section through a magnetic resonance tomography apparatus operable in accordance with the invention.

FIG. 1 shows a longitudinal section through a magnetic resonance tomography apparatus 1. The apparatus 1 has a movable bearing mechanism 2 on which a patent 7 is placed. As region of the patient 7 to be imaged, the head is thereby positioned within an imaging volume 6 of the apparatus 1. The apparatus 1 further contains a gradient coil system 3 that is connected to a controlled power supply 4, so that currents in the gradient coil system 3 can be controlled, among other things for the purpose of a location coding. The apparatus further has a radio-frequency system, only a radio-frequency antenna 5 thereof being shown as an example. The radio-frequency signals emitted into the patient 7 by the radio-frequency antenna 5 for triggering magnetic resonance signals can likewise—among other things—has a location-coding effect.

Figure 2:
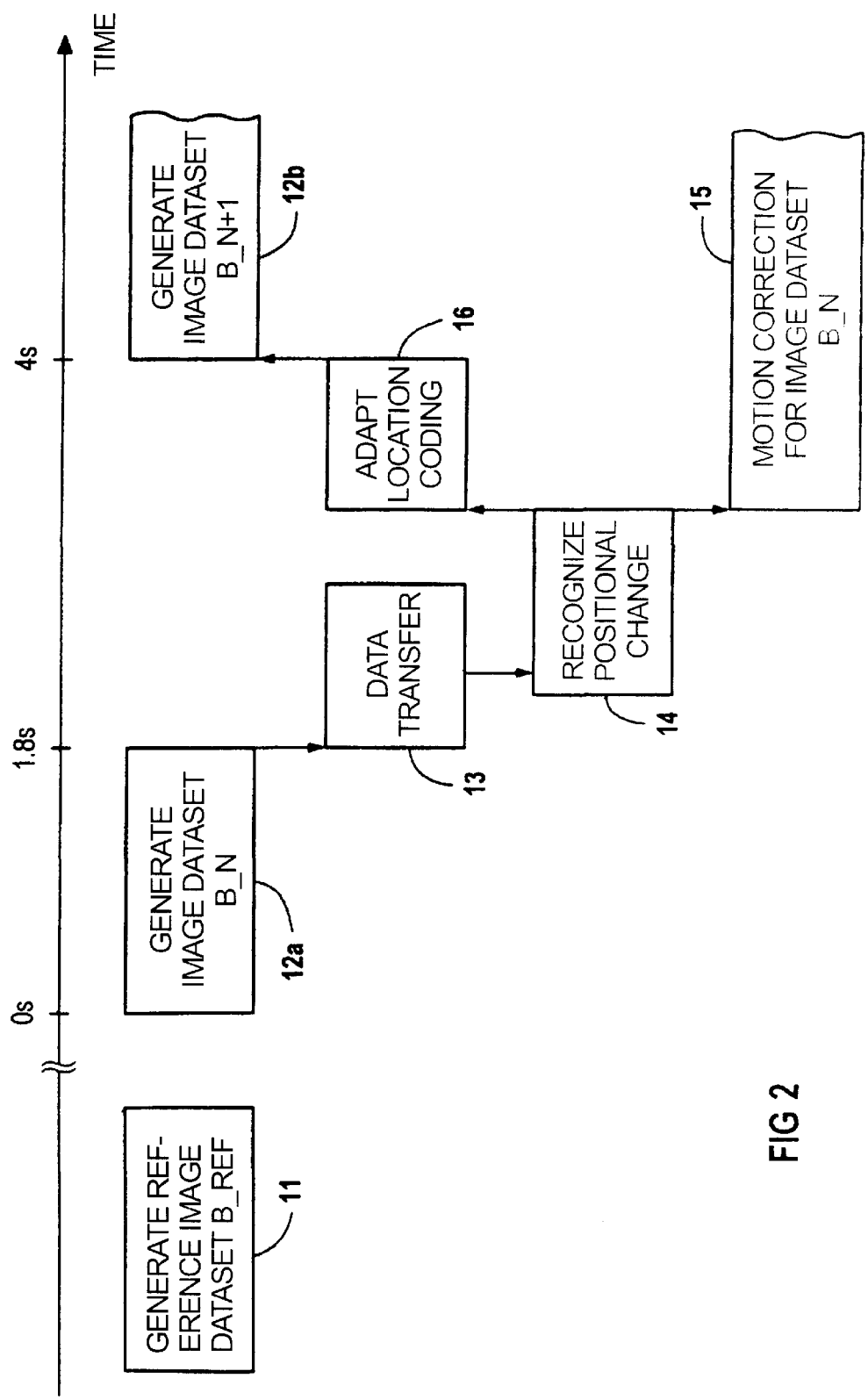
FIG. 2 is a flowchart for a functional magnetic resonance tomography procedure with prospective motion correction in a first embodiment thereof in accordance with the invention.

As an exemplary embodiment of the invention, FIG. 2 shows a flowchart for a functional magnetic resonance tomography procedure with prospective motion correction. A reference image dataset B_Ref is generated in a first step 11. This, for example, is a three-dimensional image dataset of a brain of a patient that, for example, generated with an echo planar method. In functional magnetic resonance tomography, a number of image datasets of the brain are generated in a time sequence. Generation of a three-dimensional image dataset B_N begins at a time 0 s in a step 12a, this being finished at the time 1.8 s. A data transfer follows the step 12a in a step 13. A data exchange between various computer units of a magnetic resonance tomography occurs, for example, during this data transfer. A recognition of a positional change occurs in the following step 14. The image dataset B_N is compared to the reference image dataset B_Ref, for example with the method for determining positional changes from image datasets that was initially described. When a positional change of the brain caused, for example, by movement on the part of the patient, has occurred between the reference image dataset B_Ref and the image dataset B_N, then this positional change is identified with high precision in step 14. Before generating a further image dataset B_N+1 beginning at the time 4 s in a step 12b, the positional change identified in the step 14 leads—in a step 16—to a corresponding adaptation of the location coding. In a step 15, further, the positional change identified in step 14 can be used to process the image dataset B_N for the purpose of a fine, retro-perspective motion correction. To that end, known interpolation methods such as a linear interpolation or a Fourier interpolation can be utilized, for example. The Fourier interpolation is described in greater detail in, for example, the article by W. F. Eddy et al., "Improved Image Registration by Using Fourier Interpolation", Magnetic Resonance in Medicine 36 (1996), pages 923–931. An analysis of clinical image datasets has shown that the aforementioned fine correction can be foregone in many cases because the positional changes from image dataset to image dataset are usually smaller than 50 μm. If no positional change is found in step 14, then an adaptation of the location coding in step 16 as well as a fine correction in step 15 are not necessary.

Figure 3:
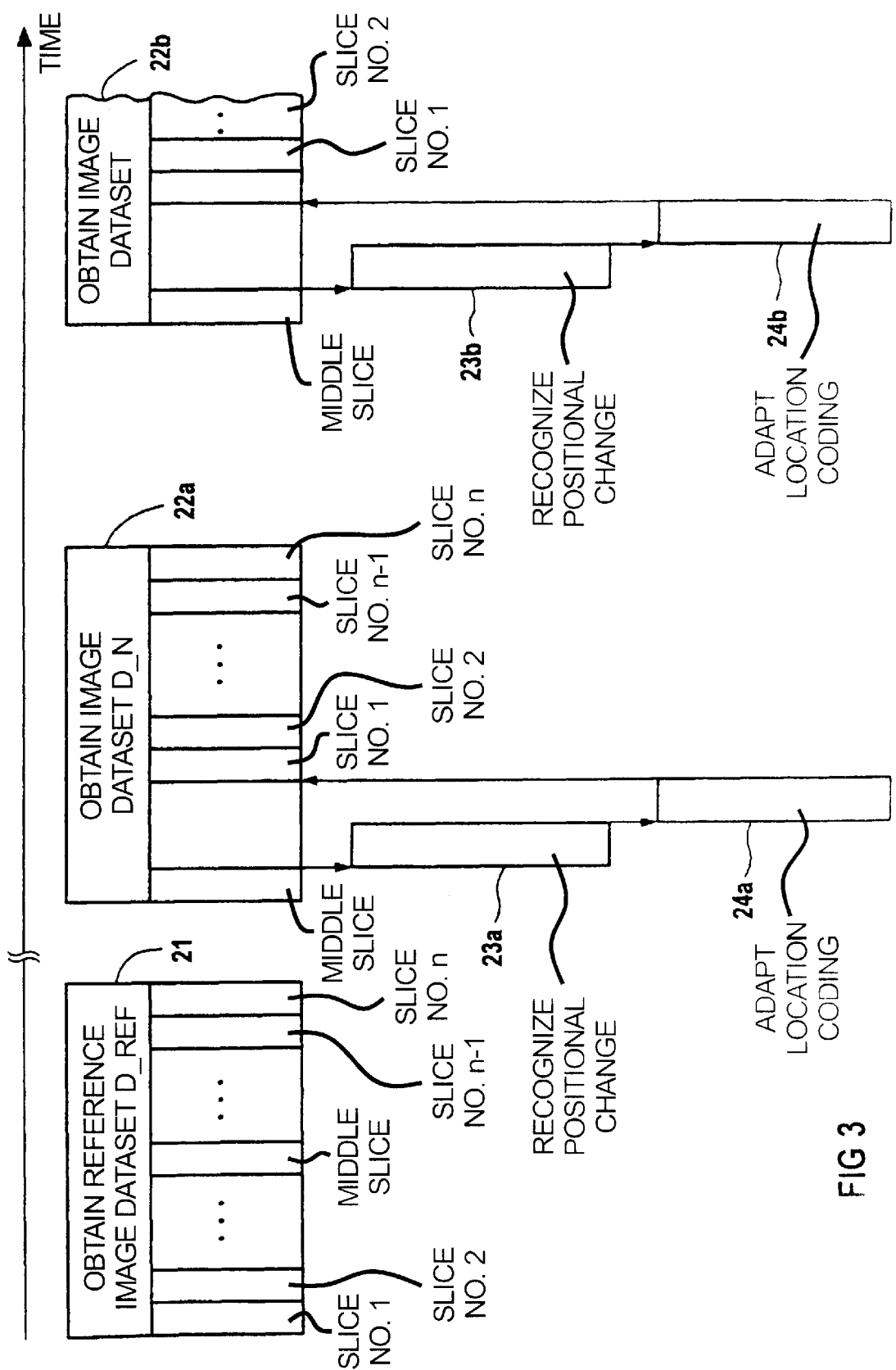
FIG. 3 is a flowchart for a functional magnetic resonance tomography procedure with a prospective motion correction in a second embodiment thereof in accordance with the invention.

As a further exemplary embodiment of the invention, FIG. 3 shows a flowchart for a functional magnetic resonance tomography with a prospective motion correction. In the scope of a functional magnetic resonance tomography procedure, a reference image dataset D_Ref is produced in a first step 21. This, for example, is a three-dimensional image dataset of a brain of a patient that is in turn composed of a specific number of two-dimensional image datasets of slices No. 1 through No. n. One of the aforementioned slices is a selected middle slice that preferably represents a central region of the brain. An image dataset D_N is generated in a further step 22a. To that end, a two-dimensional image dataset of said middle slice is first produced. In a step 23a, this is compared to the two-dimensional reference image dataset of the middle slice in view of positional changes, for example using the initially described method. In another embodiment, a so-called slice into volume mapping method is used for comparison to the three-dimensional reference image dataset D_Ref, so that arbitrary positional changes in the three-dimensional space can be identified. For example, the article by B. Kim et al., "Motion Correction in fMRI via Registration of Individual Slices Into an Anatomical Volume", Magnetic Resonance in Medicine 41 (1999), pages 964–972, provides for a more detailed description of the slice into volume mapping method. If a positional change is identified, the location coding is correspondingly adapted in a step 24a for the further two-dimensional image datasets of the remaining slices. When no positional changes are determined in the step 23a, then the other slices of the image dataset D_N are generated with a location coding that has not been modified compared to the reference image dataset D_Ref. In a specific timing clock of the functional magnetic resonance tomography procedure, a further image dataset is generated in a step 22b. One thereby proceeds in conformity with the image dataset B_N.

The above exemplary embodiments for a functional magnetic resonance tomography procedure for detecting active regions of a brain can be correspondingly transferred to applications having different functional tasks such as diffusion coding and perfusion coding.

Figure 4:
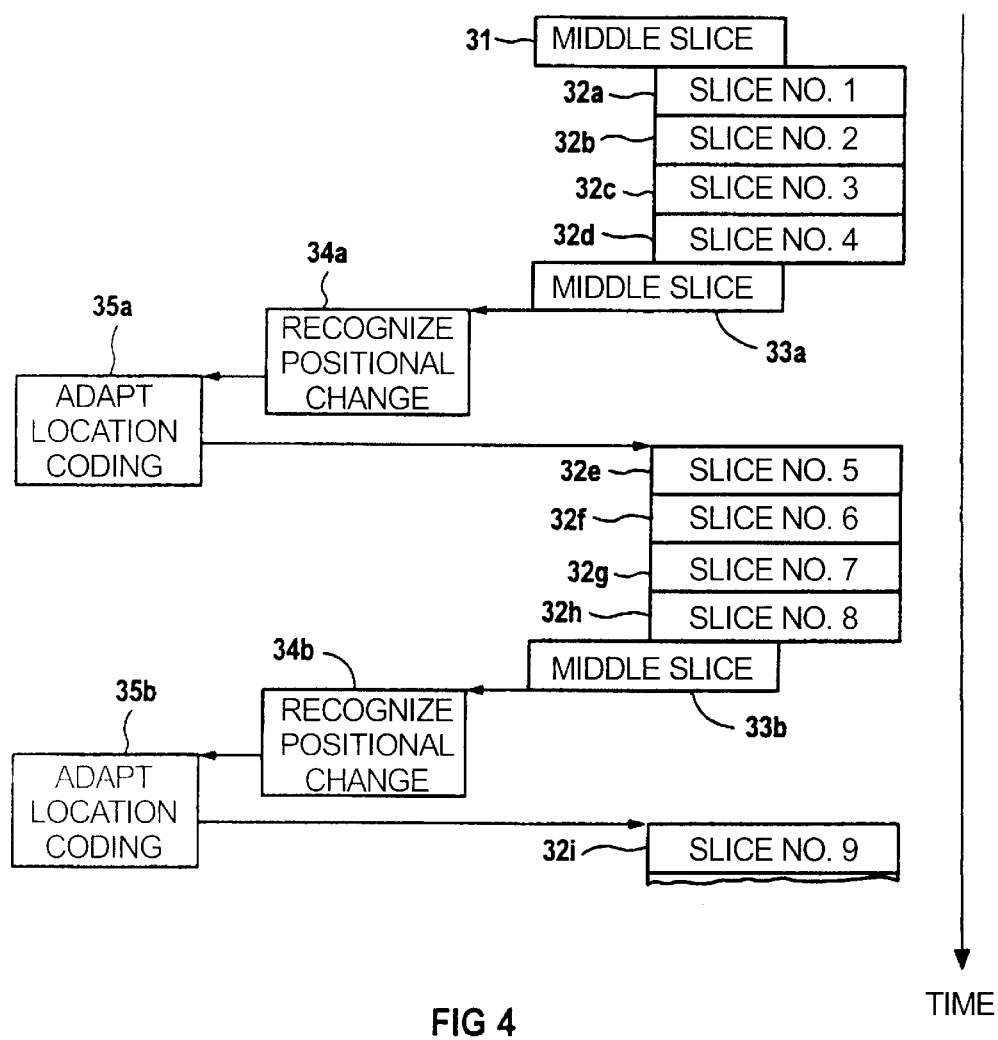
FIG. 4 is a flowchart for generating an individual, multi-slice image dataset with looped-in motion correction in accordance with the invention.

As a further exemplary embodiment of the invention, FIG. 4 shows a flowchart for generating a single three-dimensional image dataset with looped-in prospective motion correction. For example, a single three-dimensional image dataset of a brain of a patient is to be generated slice-by-slice. In a first step, for example, a two-dimensional reference image dataset of a selected middle slice is generated, preferably containing a central region of the brain. In further steps 32a through 32d, the slices No. 1 through No. 4 are imaged as two-dimensional image datasets for producing the three-dimensional image dataset. In a further step 33a, a two-dimensional image dataset of said middle slice is again generated, this being compared in a step 34a to the reference image dataset of the middle slice for detecting a positional change. For example, the initially described method for determining positional changes from image datasets is utilized for this purpose. When a positional change is detected in the step 34a, a corresponding adaptation of a location coding ensues in a step 35a before further slices No. 5 through No. 8 are registered motion-corrected as two-dimensional image datasets in the steps 32e through 32h. Another registration of a two-dimensional image dataset of said middle layer in step 33b follows the step 32h. The image dataset generated in the step 33b is handled in steps 34b and 35b analogous to steps 34a and 35a explained earlier. The method achieves results in positional changes of the brain caused, for example, by movement on the part of the patient, being recognized during the registration of the three-dimensional image data so they do not lead to image distortions.

Although various minor modifications might be suggested by those skilled in the art, it should be understood that my wish to embody within the scope of the patent warranted hereon all such modifications as reasonably and properly come with the scope of my contribution to the art.

I claim as my invention:

1. A method for operating a magnetic resonance tomography apparatus having a gradient system and a radio-frequency system which, in combination, provide location coding for magnetic resonance signals from an examination subject, said method comprising the steps:

placing a region to be imaged in an examination subject in an imaging volume of said magnetic resonance tomography apparatus;

obtaining image datasets of at least portions of said region in a time sequence;

determining a positional change of at least a part of said region with respect to said imaging volume by comparing a first of said image datasets to a second of said image datasets, said first and second image datasets being generated in chronological succession; and adapting said location coding to said positional change for at least one of said image datasets which is obtained in time following said first and second image datasets.

2. A method as claimed in claim 1 comprising the additional steps of noting selected values of said first image dataset in a first column vector;

selecting values from said second image dataset dependent on the selected values of said first image dataset, and noting the selected values of the second image dataset in a second column vector;

noting six parameters with which an arbitrary positional change in three-dimensional space can be described, in a third column vector;

forming a Jacobean functional matrix from partial derivatives of corresponding values of said first column vector according to the six parameters, per row;

forming an equation according to a Taylor expansion of the first order by setting a difference between said second column vector and said first column vector equal to a product of said Jacobean functional matrix with said third column vector; and solving said equation by determining said six parameters with an iteration technique.

3. A method as claimed in claim 1 comprising obtaining two-dimensional image datasets as said plurality of datasets.

4. A method as claimed in claim 3 comprising obtaining two-dimensional image datasets which are components of a three-dimensional image dataset, as said plurality of image datasets.

5. A method as claimed in claim 1 comprising obtaining three-dimensional image datasets as said plurality of image datasets.

6. A method as claimed in claim 1 comprising obtaining said image datasets in a functional magnetic resonance tomograph procedure.

7. A method as claimed in claim 1 comprising obtaining said image datasets using an echo planar method.

* * * * *